(12) United States Patent
Okada et al.

(10) Patent No.: US 11,282,932 B2
(45) Date of Patent: Mar. 22, 2022

(54) SEMICONDUCTOR DEVICE AND MANUFACTURING METHOD

(71) Applicant: KIOXIA CORPORATION, Tokyo (JP)

(72) Inventors: Shunsuke Okada, Suzuka Mie (JP); Tatsunori Isogai, Yokkaichi Mie (JP); Masaki Noguchi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 108 days.

(21) Appl. No.: 16/807,519

(22) Filed: Mar. 3, 2020

(65) Prior Publication Data

US 2021/0083064 A1    Mar. 18, 2021

(30) Foreign Application Priority Data

Sep. 17, 2019  (JP) .............. JP2019-168472

(51) Int. Cl.
| | |
|---|---|
| H01L 29/423 | (2006.01) |
| H01L 27/11568 | (2017.01) |
| H01L 21/02 | (2006.01) |
| H01L 29/51 | (2006.01) |
| H01L 21/28 | (2006.01) |
| H01L 27/11582 | (2017.01) |

(52) U.S. Cl.
CPC ...... *H01L 29/4234* (2013.01); *H01L 21/0217* (2013.01); *H01L 27/11568* (2013.01); *H01L 27/11582* (2013.01); *H01L 29/40117* (2019.08); *H01L 29/518* (2013.01)

(58) Field of Classification Search
CPC .......... H01L 29/4234; H01L 29/40117; H01L 21/0217; H01L 27/11568; H01L 27/11582; H01L 29/518
See application file for complete search history.

(56) References Cited

U.S. PATENT DOCUMENTS

| | | | |
|---|---|---|---|
| 9,935,122 B2 | 4/2018 | Ino et al. | |
| 10,153,262 B2 | 12/2018 | Isogal et al. | |
| 2005/0230766 A1 | 10/2005 | Nomoto et al. | |
| 2011/0175157 A1* | 7/2011 | Sekine | H01L 29/66833 257/324 |
| 2016/0343657 A1* | 11/2016 | Sawa | H01L 29/40117 |
| 2019/0081144 A1* | 3/2019 | Isogai | H01L 21/02321 |

FOREIGN PATENT DOCUMENTS

| | | |
|---|---|---|
| JP | 2002-203917 A | 7/2002 |
| JP | 2011-146631 A | 7/2011 |

* cited by examiner

*Primary Examiner* — Mohammad M Choudhry
(74) *Attorney, Agent, or Firm* — Kim & Stewart LLP

(57) ABSTRACT

A semiconductor memory device includes a stacked structure and a memory pillar. The stacked structure includes electrode layers and insulating layers alternately provided on a substrate. The memory pillar extends through the stacked structure in a thickness direction. The memory pillar includes a semiconductor layer extending along the thickness direction, and a first insulating film, a charge storage layer, and a second insulating film provided around the semiconductor layer. The charge storage layer contains fluorine, and a fluorine concentration in the charge storage layer has a gradient along a plane direction of the substrate with a peak. A first distance from an inner end of the charge storage layer to the peak in the plane direction is shorter than a second distance from an outer end of the charge storage layer to the peak in the plane direction.

16 Claims, 9 Drawing Sheets

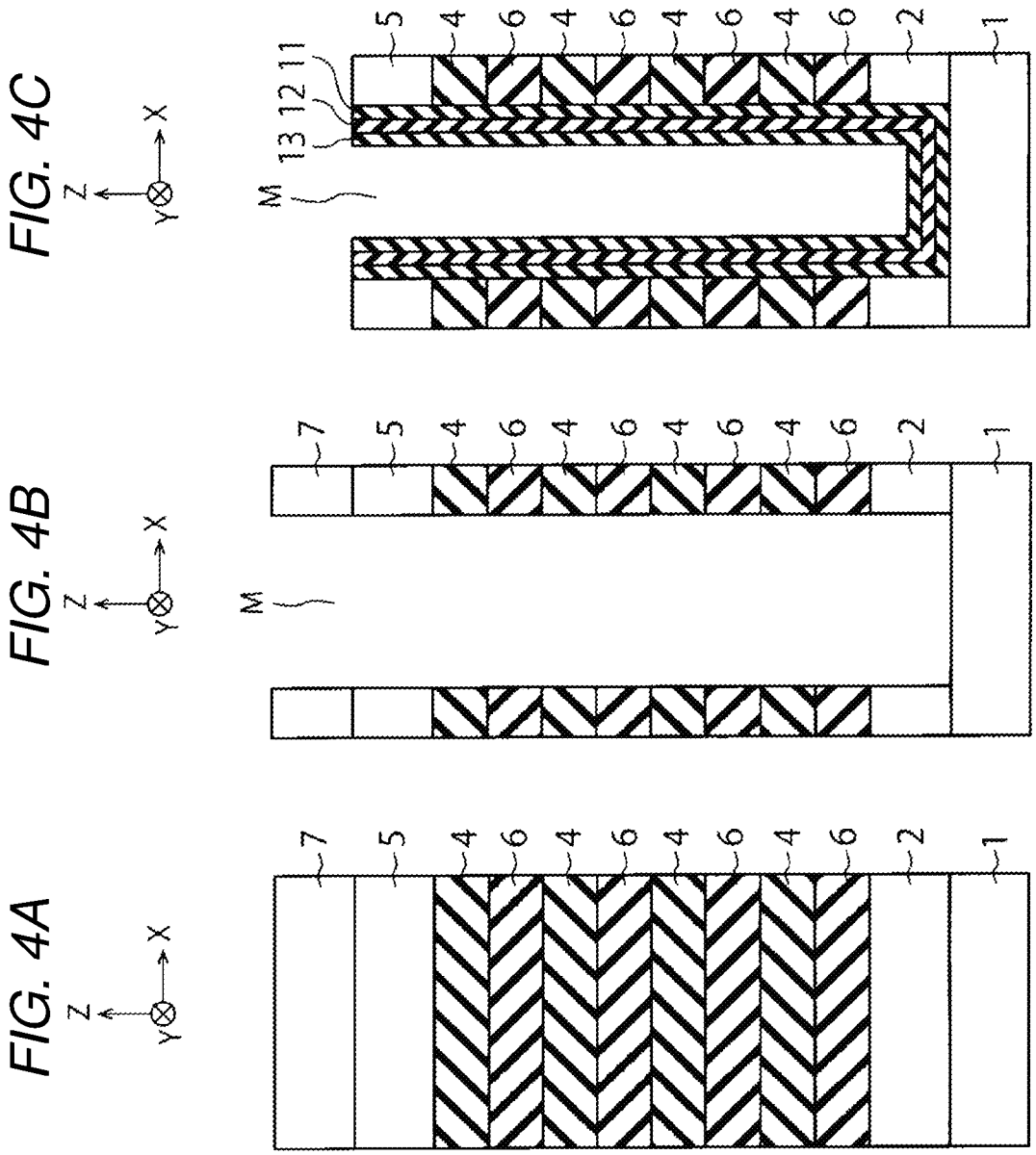

SEMICONDUCTOR DEVICE AND MANUFACTURING METHOD

CROSS-REFERENCE TO RELATED APPLICATION(S)

This application is based upon and claims the benefit of priority from Japanese Patent Application No. 2019-168472, filed on Sep. 17, 2019, the entire contents of which are incorporated herein by reference.

FIELD

Embodiments described herein relate generally to a semiconductor device and a manufacturing method thereof.

BACKGROUND

In a semiconductor memory, such as a three-dimensional memory, a charge stored in a charge storage layer of each memory cell may leak to the outside of the charge storage layer or to another memory cell.

DESCRIPTION OF THE DRAWINGS

FIGS. 4A to 4C illustrate cross-sectional views of a structure to illustrate a process step of a manufacturing method of the semiconductor device according to the first embodiment.

DETAILED DESCRIPTION

Embodiments provide a semiconductor device directed to preventing leakage of a charge stored in a charge storage layer and a manufacturing method thereof.

In general, according to an embodiment, a semiconductor memory device includes a stacked structure and a memory pillar. The stacked structure includes a plurality of electrode layers and a plurality of insulating layers that are alternately provided on a substrate. The memory pillar extends through the stacked structure in a thickness direction. The memory pillar includes a semiconductor layer extending along the thickness direction, a first insulating film surrounding the semiconductor layer, a charge storage layer surrounding the first insulating film, and a second insulating film surrounding the charge storage layer. The charge storage layer contains fluorine, and a fluorine concentration in the charge storage layer has a gradient along a plane direction of the substrate with a peak. A first distance from an inner end of the charge storage layer to a location of the peak in the plane direction is shorter than a second distance from an outer end of the charge storage layer to the location of the peak in the plane direction.

Hereinafter, example embodiments of the present disclosure will be described with reference to the accompanying drawings. In the figures, the same component, element, or aspect will be denoted with the same reference symbol, and a redundant description of such repeated components, element, or aspects may be omitted.

First Embodiment

Figure 1:
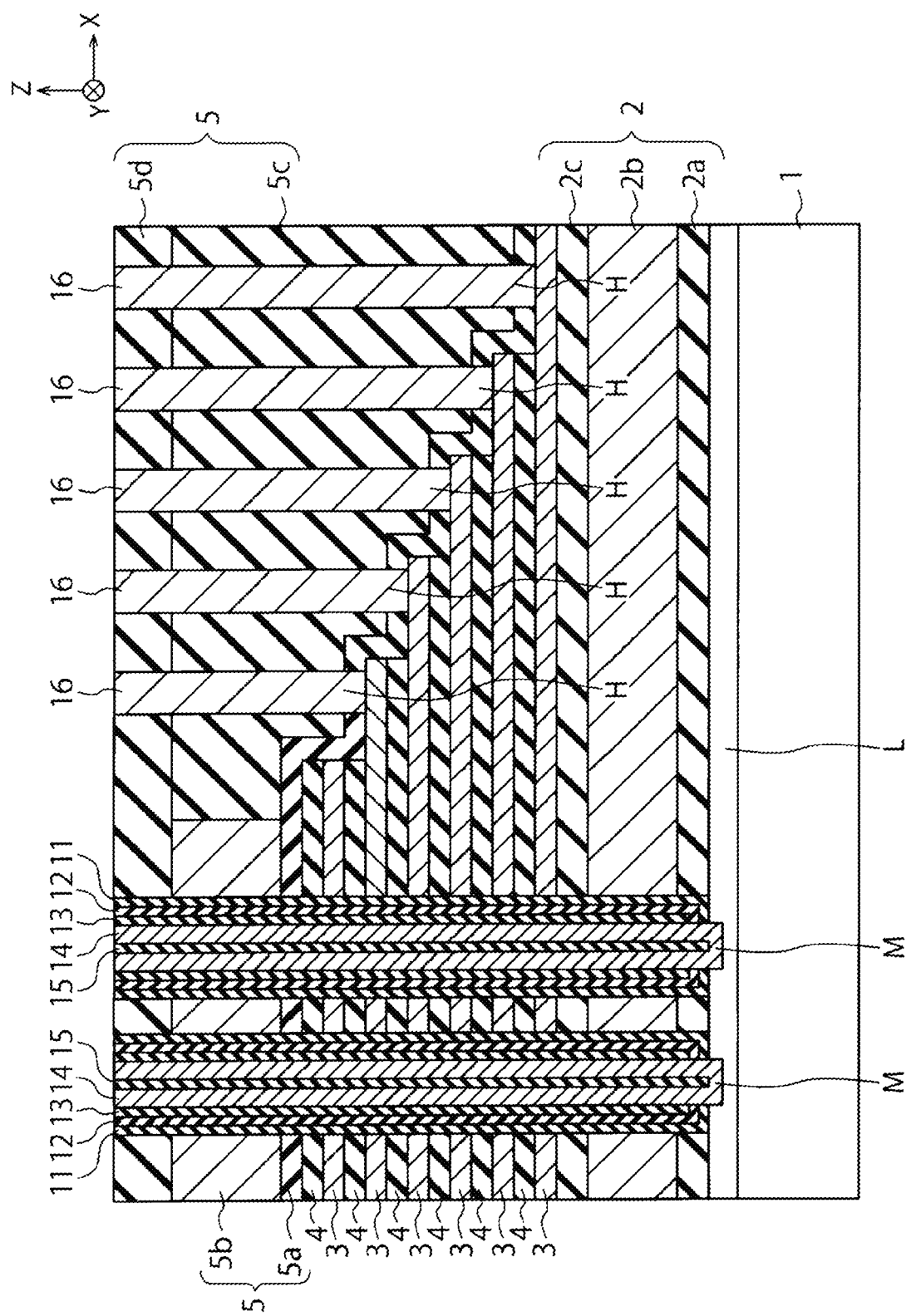
FIG. 1 illustrates a cross-sectional view of a structure of a semiconductor device according to a first embodiment.

FIG. 1 illustrates a cross-sectional view of a structure of a semiconductor device according to a first embodiment. The semiconductor device in FIG. 1 is a three-dimensional memory.

The semiconductor device in FIG. 1 includes a substrate 1, a lower layer 2, a plurality of electrode layers 3, a plurality of insulating layers 4, an upper layer 5, a plurality of memory holes M, and a plurality of contact holes H. The semiconductor device in FIG. 1 further includes a block insulating film 11, a charge storage layer 12, a tunnel insulating film 13, a channel semiconductor layer 14, and a core insulating film 15 provided in order in each memory hole M, and a contact plug 16 provided in each contact hole H. The block insulating film 11 is an example of a first insulating film, the tunnel insulating film 13 is an example of a second insulating film, and the electrode layer 3 is an example of a first layer. A structure in the memory hole M, e.g., the block insulating film 11, the charge storage layer 12, the tunnel insulating film 13, the channel semiconductor layer 14, and the core insulating film 15 may be collectively referred to as a memory pillar.

The substrate 1 is, for example, a semiconductor substrate such as a silicon (Si) substrate. FIG. 1 illustrates an X direction and a Y direction parallel to a surface of the substrate 1 and perpendicular to each other, and a Z direction perpendicular to the surface of the substrate 1. In the specification, a +Z direction is defined as an upward direction, and a −Z direction is defined as a downward direction. The −Z direction may coincide with a gravity direction or may not coincide with the gravity direction. Hereinafter, each of the X direction and the Y direction may be referred to as a surface direction of the substrate 1, and the Z direction may be referred to as a thickness direction of the substrate 1.

The lower layer 2 is formed on a diffusion layer L formed in the substrate 1, and includes a first lower insulating film 2a, a source side conductive layer 2b, and a second lower insulating film 2c that are sequentially formed on the substrate 1. The first lower insulating film 2a is, for example, a silicon oxide film ($SiO_2$). The source side conductive layer 2b is, for example, a polysilicon layer. The second lower insulating film 2c is, for example, the silicon oxide film.

The plurality of electrode layers 3 and the plurality of insulating layers 4 are alternately stacked on the lower layer 2. The electrode layer 3 is, for example, a metal layer such as a tungsten (W) layer, and functions as a word line. The insulating layer 4 is, for example, the silicon oxide film. FIG. 1 illustrates the plurality of memory holes M penetrating a stacked film (or may be referred to as a stacked structure) including the electrode layer 3 and the insulating layer 4, and the plurality of contact holes H formed on a staircase region of the stacked film.

The upper layer 5 is formed on the stacked film, and includes a cover insulating film 5a, a drain side conductive layer 5b, a first interlayer insulating film 5c, and a second interlayer insulating film 5d. The cover insulating film 5a is formed on the stacked film. The drain side conductive layer 5b is formed on the cover insulating film 5a so as to be adjacent to the staircase region. The first interlayer insulating film 5c is formed on the cover insulating film 5a so as to fill a space on the staircase region. The second interlayer insulating film 5d is formed on the drain side conductive layer 5b and the first interlayer insulating film 5c. The cover insulating film 5a is, for example, the silicon oxide film. The drain side conductive layer 5b is, for example, the polysilicon layer. The first interlayer insulating film 5c is, for example, the silicon oxide film. The second interlayer insulating film 5d is, for example, the silicon oxide film.

The block insulating film 11, the charge storage layer 12, the tunnel insulating film 13, the channel semiconductor layer 14, and the core insulating film 15 are sequentially formed on the side surface of each memory hole M that penetrates the lower layer 2, the plurality of electrode layers 3, the plurality of insulating layers 4, and the upper layer 5. As a result, a plurality of memory cells are formed in each memory hole M. The block insulating film 11 is, for example, the silicon oxide film. The charge storage layer 12 is, for example, a silicon nitride film (SiN). The tunnel insulating film 13 is, for example, the silicon oxide film. The channel semiconductor layer 14 is, for example, the polysilicon layer and is electrically connected to the diffusion layer L in the substrate 1. The core insulating film 15 is, for example, the silicon oxide film.

In the staircase region, the plurality of contact plugs 16 are formed in the plurality of contact holes H that penetrate the upper layer 5. These contact plugs 16 are electrically connected to the electrode layers 3 different from each other. Each contact plug 16 is formed of, for example, a barrier metal layer such as a titanium (Ti) containing layer and a tantalum (Ta) containing layer, and a plug material layer such as a tungsten layer, a copper (Cu) layer, and an aluminum (Al) layer.

Figure 2:
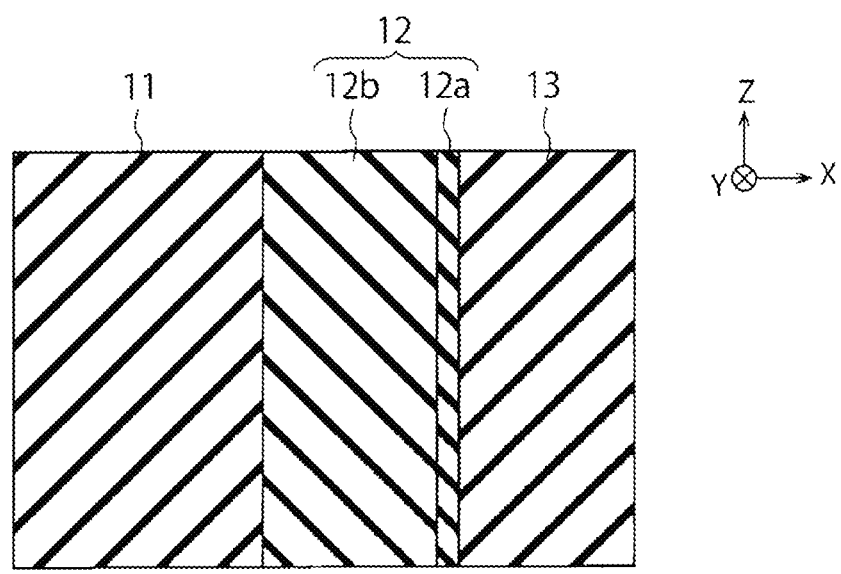
FIG. 2 illustrates a cross-sectional view of a structure of a charge storage layer according to the first embodiment.

FIG. 2 illustrates a cross-sectional view of a structure of the charge storage layer 12 of the first embodiment. FIG. 2 illustrates the block insulating film 11, the charge storage layer 12, and the tunnel insulating film 13 described above.

As illustrated in FIG. 2, the charge storage layer 12 of the present embodiment includes a fluorine containing region 12a and the other region 12b. These regions 12a and 12b are both formed of the silicon nitride film, and the fluorine containing region 12a further contains fluorine (F) as an impurity. On the other hand, the other region 12b does not contain fluorine or contains fluorine having concentration significantly lower than that of the fluorine containing region 12a. These regions 12a and 12b are generally cylindrical in shape, and the fluorine containing region 12a surrounds the other region 12b. In the present embodiment, the fluorine containing region 12a contacts the tunnel insulating film 13, and the other region 12b contacts the block insulating film 11. The fluorine containing region 12a is an example of the first region.

Figure 3A:
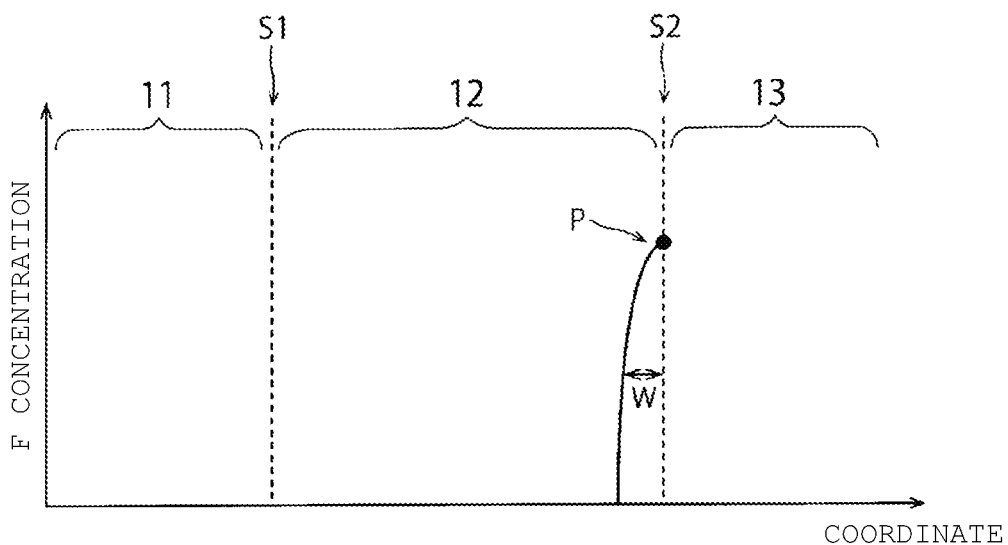
FIGS. 3A and 3B are graphs illustrating examples of fluorine concentration distribution in the charge storage layer according to the first embodiment.
Figure 3B:
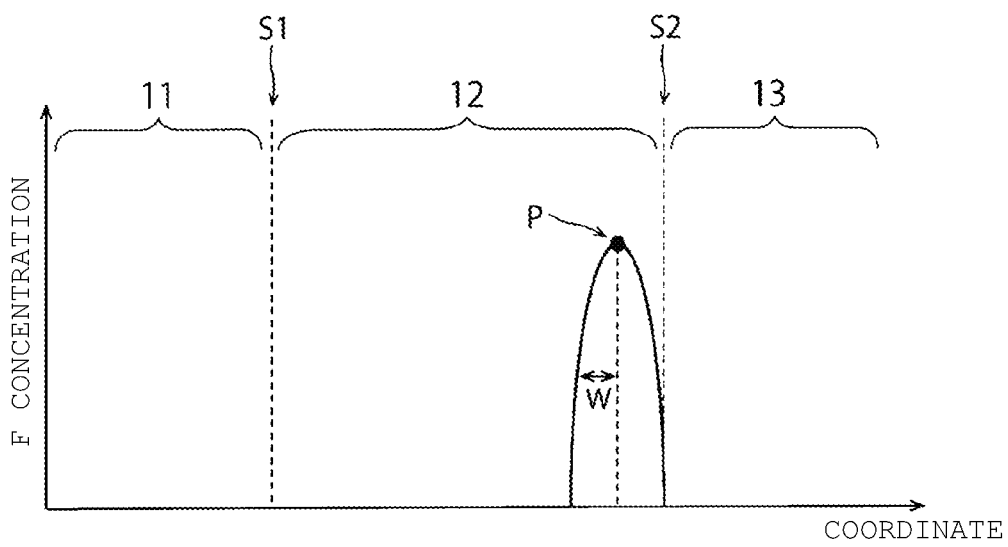

FIGS. 3A and 3B are graphs illustrating examples of fluorine concentration distribution in the charge storage layer 12 according to the first embodiment.

FIG. 3A illustrates a first example of the fluorine concentration distribution in the charge storage layer 12. A horizontal axis and a vertical axis in FIG. 3A indicate the coordinates and the fluorine concentration of each point in the charge storage layer 12. The coordinates of the horizontal axis are set so as to go from the side surface of each memory hole M toward the central axis, and are set parallel to the XY plane. The fluorine concentration in the vertical axis represents the number of fluorine atoms per unit volume in the charge storage layer 12. A reference symbol S1 indicates the interface between the charge storage layer 12 and the block insulating film 11, and a reference symbol S2 indicates the interface between the charge storage layer 12 and the tunnel insulating film 13. With respect to the above description, the same applies to FIG. 3B and the other similar graphs which will be described below. FIG. 3B illustrates a second example of the fluorine concentration distribution in the charge storage layer 12.

In FIGS. 3A and 3B, the fluorine concentration in the fluorine containing region 12a changes along the coordinates of the horizontal axis. Specifically, the fluorine concentration in FIG. 3A gradually increases and reaches its peak P (peak concentration) at interface S2. On the other hand, the fluorine concentration in FIG. 3B gradually increases, reaches its peak P before reaching the interface S2, and thereafter gradually decreases. In both FIGS. 3A and 3B, the peak P is to be considered located towards the side of the interface S2 between the interfaces S1 and S2, since the distance from the peak P to the tunnel insulating film 13 is shorter than the distance from the peak P to the block insulating film 11. The fluorine concentration in the fluorine containing region 12a of the present embodiment may have any one of the concentration profiles illustrated in FIGS. 3A and 3B or similar to those illustrated in FIGS. 3A and 3B.

The distance between the peak P and the tunnel insulating film 13 in the first example may be the same value or a different value than that depicted in the cross section of FIG. 3A. In the same manner, the distance between the peak P and the block insulating film 11 in the first example may be the same value or a different value than that depicted in the cross section of FIG. 3A. When the distance between the peak P and the tunnel insulating film 13 varies depending on the particular cross section taken, and/or when the distance between the peak P and the block insulating film 11 varies depending on the particular cross section taken, the distance between the peak P and the tunnel insulating film 13 in any cross section is desirably shorter than the distance between the peak P and the tunnel insulating film 13 in any other possible cross section, that is, the cross section providing the shortest possible distance from the peak P to the block insulating film 11. It is more desirable that the distance from the peak P to the tunnel insulating film 13 be less than the shortest possible distance from the peak P to the block insulating film 11 in any cross-section.

The distance between the peak P and the tunnel insulating film 13 in the second example may be the same value or a different value than that depicted in the cross section of FIG. 3B. Likewise, the distance between the peak P and the block insulating film 11 in the second example may be the same value or a different value than that depicted in the cross section of FIG. 3B. When the distance between the peak P and the tunnel insulating film 13 varies depending on the particular cross section taken, and/or when the distance between the peak P and the block insulating film 11 varies depending on the particular cross section taken, the distance from the peak P to the tunnel insulating film 13 in any cross section is desirably shorter than the distance from the peak P to the tunnel insulating film 13 in any other possible cross section, that is, the cross section providing shortest possible distance between the peak P and the block insulating film 11. It is even more desirable that the distance between the peak P and the tunnel insulating film 13 in any cross section be shorter than the shortest possible distance between the peak P and the block insulating film 11 of any cross section.

Hereinafter, the fluorine concentration in the fluorine containing region 12a of the present embodiment will be further described in detail with reference to FIG. 3A. However, the description is also applicable to the concentration profile in FIG. 3B.

As described above, the fluorine concentration in the fluorine containing region 12a varies so as to have a peak P. The fluorine concentration at the peak P of the present embodiment is set to $1.0 \times 10^{20}$ cm$^{-3}$ or higher, and specifically, set to $1.0 \times 10^{20}$ cm$^{-3}$ or higher and $1.0 \times 10^{22}$ cm$^{-3}$ or lower.

A reference symbol W indicates a half width at half maximum of the fluorine concentration distribution around the peak P. When the fluorine concentration at the peak P is represented by C, the half width at half maximum W is the distance between the point (coordinate) where the fluorine concentration becomes C (the point where the peak P exists) and the point (coordinate) along the concentration profile where the fluorine concentration becomes C/2. The half width at half maximum W of the present embodiment is desirably 2.5 nm or less.

As described above, the charge storage layer 12 of the present embodiment includes the fluorine containing region 12a, and the peak P for the fluorine concentration in the fluorine containing region 12a is located closer to the interface S2 than to the interface S1. Hereinafter, an advantage of the above-described charge storage layer 12 will be described.

When the charge storage layer 12 is a silicon nitride film, the charge storage layer 12 functions as a layer for storing a charge by trapping an electron at a trap level formed by a defect in the silicon nitride film. However, it is known that a trapped electron escapes (leaks) from the silicon nitride film by hopping conduction that moves via the trap level. The hopping conduction can easily occur when the trap level is shallow and/or when the trap density is high. In the former case, since energy required for the electron to escape from the trap level is reduced, the hopping conduction can easily occur. In the latter case, since the physical distance between the trap levels is reduced, the hopping conduction can easily occur.

To address the above issues, in the present embodiment, fluorine is added to the silicon nitride film that forms the charge storage layer 12. The fluorine added to the silicon nitride film is considered to form a Si—F bond and to form a deep trap level. Thus, according to the present embodiment, fluorine is added to the charge storage layer 12, whereby it is possible to improve a charge storage characteristic of the charge storage layer 12 from the viewpoint of a depth of the trap level.

However, it is also considered that the fluorine added to the silicon nitride film can terminate the defects in the silicon nitride film (reduce the trap density). A decrease in the trap density leads to a decrease in an amount of the trapped electron in the charge storage layer 12. Therefore, when fluorine is added to the charge storage layer 12, the charge storage characteristic of the charge storage layer 12 may deteriorate from the viewpoint of a decrease in the trap density.

To address the above issues, in the present embodiment, fluorine is added only to a part of the charge storage layer 12 without adding fluorine to the whole charge storage layer 12. As a result, the fluorine containing region 12a and the other region 12b are both provided in the charge storage layer 12. In the present embodiment, since the region where the trap density decreases can be limited to the fluorine containing region 12a, it is possible to prevent the deterioration in the charge storage characteristic caused by the decrease in the trap density. On the other hand, in the present embodiment, since the deep trap level can be formed in the fluorine containing region 12a, it is possible to obtain improvement in the charge storage characteristic according to provision of the deeper trap level. As described above, according to the present embodiment, fluorine is added only to a part of the charge storage layer 12, whereby it is possible to obtain the benefit of fluorine addition more effectively than a case where fluorine is added to the whole charge storage layer 12.

However, with respect to the fluorine containing region 12a and the other region 12b in the charge storage layer 12, the other region 12b may also contain fluorine having a relatively low concentration. For example, the fluorine concentration in the fluorine containing region 12a may be set to $1.0 \times 10^{20}$ cm$^{-3}$ or higher, and the fluorine concentration in the other region 12b may be set to less than $1.0 \times 10^{20}$ cm$^{-3}$. Also, when the fluorine added to the fluorine containing region 12a diffuses to the other region 12b, the other region 12b may thus contain fluorine at some concentration level.

The cases in which fluorine is added, that is, an area where the fluorine containing region 12a is formed, is set to be in the vicinity of the interface S1, in the vicinity of the interface S2, and at a location away from the interfaces S1 and S2. The fluorine containing region 12a of the present embodiment is formed in the vicinity of the interface S2, and hereinafter, an advantage of forming the fluorine containing region 12a at this location will be described.

The semiconductor device of the present embodiment performs a write operation by injecting the electron from the tunnel insulating film 13 into the charge storage layer 12. It is known that the electron injected into the charge storage layer 12 is unevenly distributed closer to the interface S2 between the charge storage layer 12 and the tunnel insulating film 13. Since it is possible to deepen the trap level of a place where the injected electron mainly exists by forming the fluorine containing region 12a in the vicinity of the interface S2, the charge storage characteristic of the charge storage layer 12 can be effectively improved. At least for that reason, the fluorine containing region 12a of the present embodiment is formed near the interface S2 between the charge storage layer 12 and the tunnel insulating film 13.

On the other hand, an electron existing in the vicinity of the block insulating film 11 in the charge storage layer 12 may move from the side of the block insulating film 11 to the side of the tunnel insulating film 13 in the charge storage layer 12, and may escape to the outside via the tunnel insulating film 13. It is conceivable to form the fluorine containing region 12a not in the vicinity of the interface S2, but rather in the vicinity of the interface S1 or at a location equidistant from interfaces S1 and S2. As a result, it is possible to prevent the electrons in the vicinity of the block insulating film 11 from escaping to the outside via the tunnel insulating film 13. However, when fluorine is added to or otherwise interacts with the silicon oxide film used as the block insulating film 11, a Si—O bond of the insulating film may be broken and thus insulation resistance of the block insulating film 11 may deteriorate. At least for that reason, the fluorine containing region 12a of the present embodiment is formed away from the interface S1 and not a position equidistant, or nearly so, from the interfaces S1 and S2, but rather in the vicinity of the interface S2.

The charge storage layer 12 may include another fluorine containing region, which is substantially the same as the fluorine containing region 12a, but is provided in addition to the fluorine containing region 12a. That is, the fluorine containing region 12a may be formed in the vicinity of the interface S2, and the other fluorine containing region (similar to region 12a) may be formed at another place, for example, in the vicinity of the interface S1 or at midpoint between interfaces S1 and S2. Accordingly, it is possible to obtain the benefit of the presence of another fluorine containing region such as one in the vicinity of the interface S1 while still obtaining the benefit of the fluorine containing region 12a in the vicinity of the interface S2. Such a configuration can be adopted, for example, when the expected benefit is more than the expected disadvantage of inclusion of another fluorine containing region near the vicinity of the interface S1. A specific example of such a structure will be described in second to fourth embodiments.

As described above, according to the charge storage layer 12 of the present embodiment, it is possible to prevent the leakage of the charge stored in the charge storage layer 12 by the fluorine containing region 12a. In order to effectively prevent the leakage of the charge, the fluorine concentration at the peak P is desirably set to a high value. At least for that reason, the fluorine concentration at the peak P of the present embodiment is set from $1.0 \times 10^{20}$ cm$^{-3}$ to $1.0 \times 10^{22}$ cm$^{-3}$. Further, in order to limit a range of the fluorine containing region 12a, it is desirable to set the half width at half maximum W to a small value. At least for that reason, the half width at half maximum W of the present embodiment is set to 2.5 nm or less.

FIGS. 4A to 4C to FIGS. 6A to 6C illustrate cross-sectional views of structures to illustrate process steps of a manufacturing method of the semiconductor device according to the first embodiment.

First, the lower layer 2 is formed on the substrate 1, and a plurality of sacrificial layers 6 and the plurality of insulating layers 4 are alternately stacked on the lower layer 2 (refer to FIG. 4A). The sacrificial layer 6 is, for example, the silicon nitride film. The sacrificial layer 6 is an example of the first layer. In the process of FIG. 4A, the plurality of electrode layers 3 and the plurality of insulating layers 4 may be alternately stacked on the lower layer 2. In this case, a process of replacing the sacrificial layer 6 with the electrode layer 3 (which will be described below) is not required to be performed. Next, the upper layer 5 is formed on the stacked film including the sacrificial layer 6 and the insulating layer 4, and a mask layer 7 is formed on the upper layer 5 (FIG. 4A).

Next, after patterning the mask layer 7, the upper layer 5, the stacked film, and the lower layer 2 are processed by etching using the mask layer 7 as an etching mask (FIG. 4B). As a result, the memory hole M that penetrates the upper layer 5, the stacked film, and the lower layer 2, and then reaches the substrate 1 is formed.

Next, the block insulating film 11, the charge storage layer 12, and the tunnel insulating film 13 are sequentially formed on the side surface and the bottom surface of the memory hole M (FIG. 4C). The block insulating film 11 is, for example, the silicon oxide film, and may be a high-k insulating film (high dielectric constant insulating film) or a stacked film including the silicon oxide film and the high-k insulating film. The charge storage layer 12 is, for example, the silicon nitride film. The tunnel insulating film 13 is, for example, the silicon oxide film, and may be the high-k insulating film or the stacked film including the silicon oxide film and the high-k insulating film.

Figure 5:
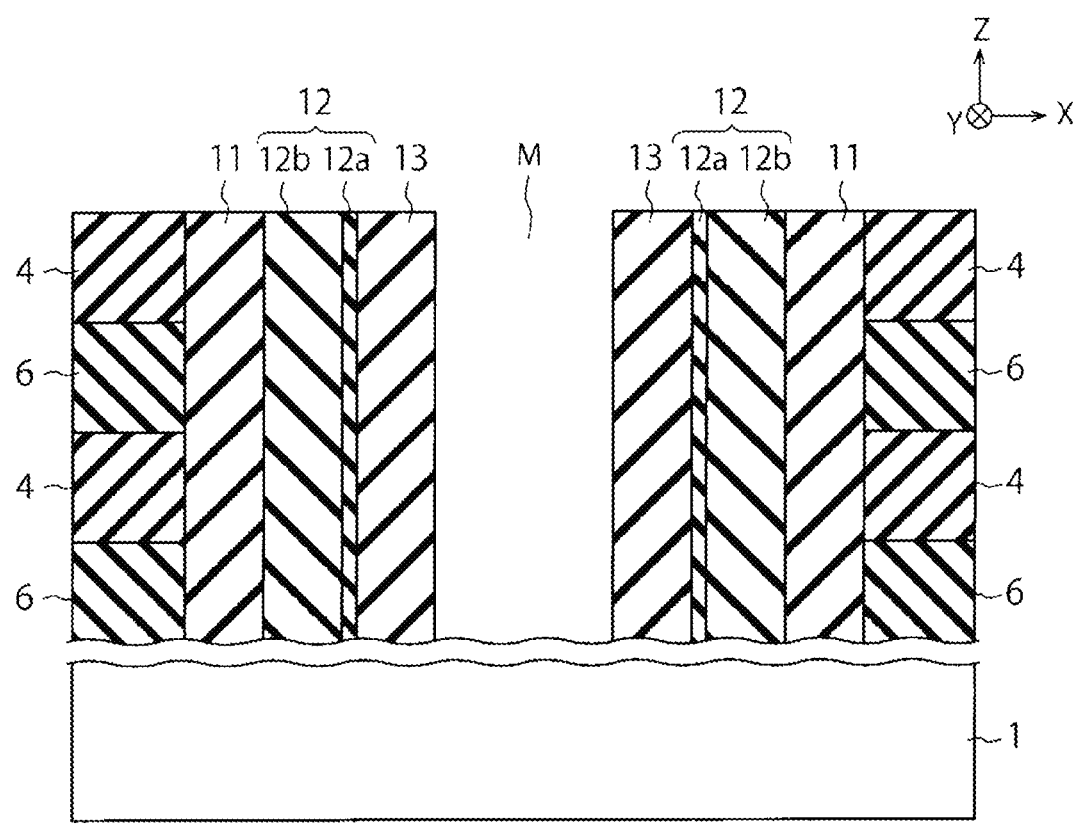
FIG. 5 illustrates a cross-sectional view of a structure to illustrate a process step of the manufacturing method of the semiconductor device according to the first embodiment.

FIG. 5 is a cross-sectional view illustrating a process of FIG. 4C more in detail. The charge storage layer 12 in FIG. 5 includes the fluorine containing region 12a and the other region 12b. For example, the charge storage layer 12 is formed as follows.

First, the silicon nitride film that does not contain fluorine is formed as the charge storage layer 12 on a surface of the block insulating film 11. The silicon nitride film is formed by, for example, atomic layer deposition (ALD) or low-pressure chemical vapor deposition (LPCVD) using a Si source gas such as dichlorosilane (DCS), tetrachlorosilane (TCS), and hexachlorodisilane (HCD), and a nitriding agent such as ammonia ($NH_3$).

Next, fluorine is introduced into the vicinity of a surface of the charge storage layer 12. For example, in a gas containing fluorine, such as a fluorine gas ($F_2$), a hydrogen fluoride gas (HF), and a nitrogen trifluoride gas ($NF_3$), fluorine is introduced into the charge storage layer by heat-treating the charge storage layer 12 at a temperature of about 300° C. to 650° C. for about 10 to 30 minutes. As a result, the fluorine containing region 12a having the concentration profile illustrated in FIG. 3A is formed in the charge storage layer 12. That is, the fluorine containing region 12a which has the peak P of the fluorine concentration on the surface of the charge storage layer 12 and whose fluorine concentration decreases from the surface of the charge storage layer 12 toward the block insulating film 11 is formed. FIG. 5 illustrates the fluorine containing region 12a and the other region 12b formed in the charge storage layer 12 in the above-described manner. Thereafter, the tunnel insulating film 13 is formed on the surface of the charge storage layer 12.

When performing the above-described heating treatment, it is desirable to select a temperature at which the silicon nitride film is not etched. Alternatively, fluorine may be introduced into the charge storage layer 12 by supplying the gas containing the fluorine atoms into a chamber while the charge storage layer 12 is formed by the ALD or the LPCVD. Thus, the fluorine containing region 12a having the concentration profile illustrated in FIG. 3A can be formed, and the fluorine containing region 12a having the concentration profile illustrated in FIG. 3B can be formed. In order to adjust the fluorine concentration profile in the charge storage layer 12, the heating treatment may be further performed on the charge storage layer 12 after fluorine is introduced into the charge storage layer 12.

Figure 6A:
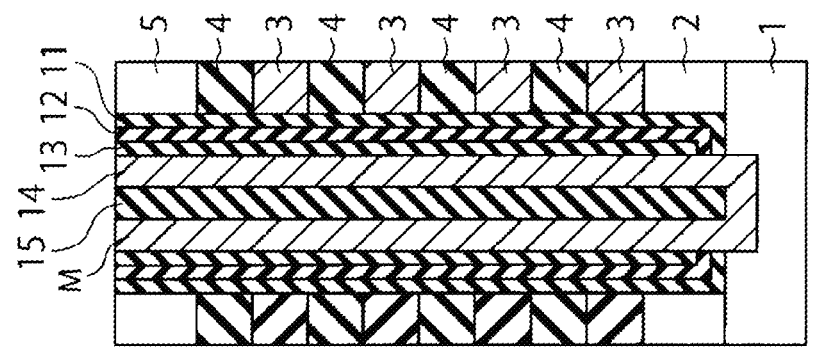
FIGS. 6A to 6C illustrate cross-sectional views of a structure to illustrate a process step of the manufacturing method of the semiconductor device according to the first embodiment.

After the process of FIG. 5, the block insulating film 11, the charge storage layer 12, and the tunnel insulating film 13 are removed from a bottom part of the memory hole M (FIG. 6A). As a result, the substrate 1 is exposed to the bottom part of the memory hole M.

Figure 6B:
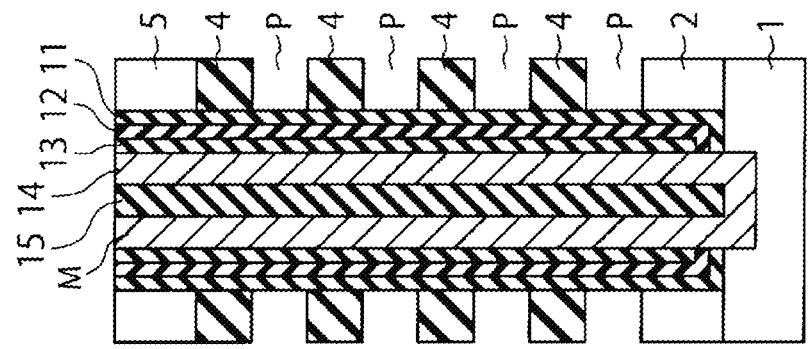

Next, the channel semiconductor layer 14 and the core insulating film 15 are sequentially formed on the surface of the tunnel insulating film 13 and the surface of the substrate 1 in the memory hole M (FIG. 6B). For example, the channel semiconductor layer 14 is formed in such a manner that an amorphous silicon layer is formed in the memory hole M at a low temperature of about 500° C., and the amorphous silicon layer is crystallized by the heating treatment at a temperature of 800° C. or higher to change the amorphous silicon layer into the polysilicon layer. Thus, surface roughness of the channel semiconductor layer 14 can be reduced. The core insulating film 15 is, for example, the silicon oxide film.

Next, the sacrificial layer 6 is removed by a chemical solution such as a phosphoric acid aqueous solution (FIG. 6B). As a result, a plurality of cavities P are formed between the insulating layers 4.

Figure 6C:
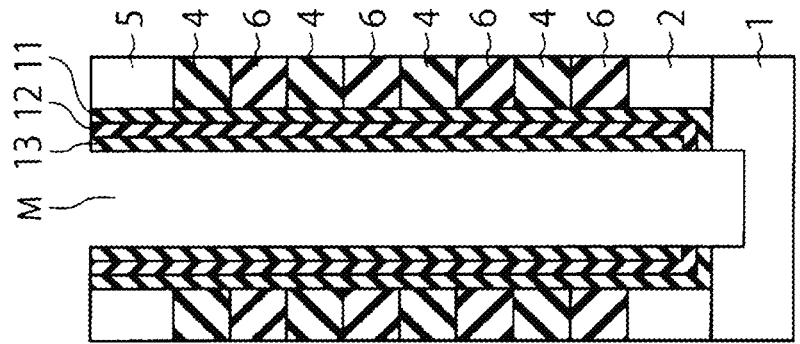

Next, the electrode layer 3 is embedded in these cavities P (FIG. 6C). As a result, the stacked film including the plurality of electrode layers 3 and the plurality of insulating layers 4 is formed on the lower layer 2. In the process of FIG. 6C, after forming the insulating film constituting a part of the block insulating film 11 in the cavity P, the electrode layer 3 may be formed in the cavity P.

Thereafter, various wiring layers, plug layers, interlayer insulating films, and the like are formed on the substrate 1. In this manner, the semiconductor device of the present embodiment is manufactured.

As described above, the charge storage layer 12 of the present embodiment includes the fluorine containing region 12a, and the peak P of the fluorine concentration in the fluorine containing region 12a is located on the side of the interface S2 of the interfaces S1 and S2. According to the present embodiment, it is possible to effectively prevent the leakage of the charge stored in the charge storage layer 12.

The fluorine containing region 12a of the present embodiment includes one peak P, and may include several peaks P. The charge storage layer 12 of the present embodiment may further include one or more fluorine containing regions separated from the fluorine containing region 12a. A specific example of the latter case will be described in the second to fourth embodiments.

Second Embodiment

Figure 7:
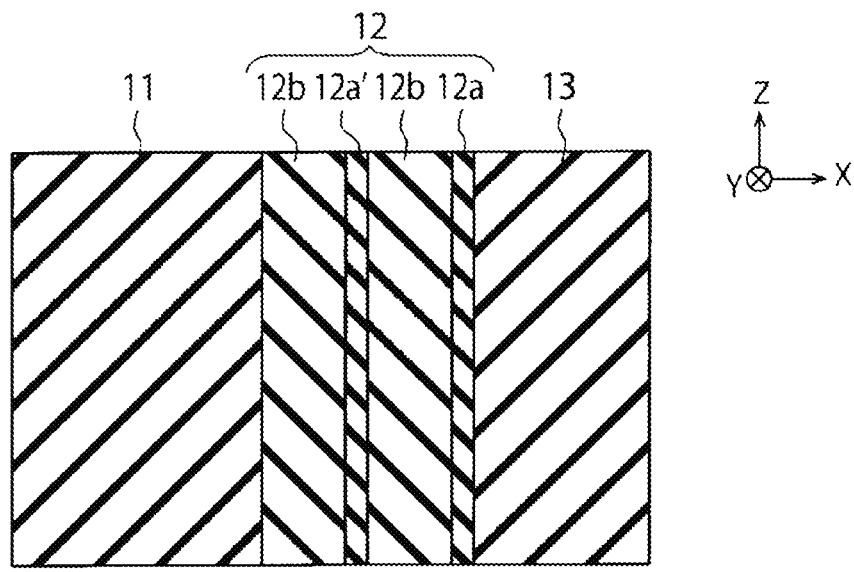
FIG. 7 illustrates a cross-sectional view illustrating a structure of a charge storage layer according to a second embodiment.

FIG. 7 illustrates a cross-sectional view of a structure of the charge storage layer 12 according to a second embodiment. FIG. 7 illustrates the block insulating film 11, the charge storage layer 12, and the tunnel insulating film 13 in FIG. 1.

The charge storage layer 12 of the present embodiment includes the fluorine containing region 12a, a further fluorine containing region 12a', and two other regions 12b. These regions 12a, 12a', and 12b are all formed of the silicon nitride film, and the fluorine containing regions 12a and 12a' further contain fluorine as an impurity. On the other hand, the other region 12b does not contain fluorine or contains fluorine having concentration significantly lower than that of the fluorine containing region 12a. These regions 12a, 12a', and 12b are generally cylindrical in shape, and the fluorine containing region 12a surrounds the fluorine containing region 12a'. In the present embodiment, the fluorine containing region 12a contacts the tunnel insulating film 13, and the fluorine containing region 12a' does not contact the block insulating film 11 and the tunnel insulating film 13. The fluorine containing region 12a' is an example of the second region.

Figure 8:
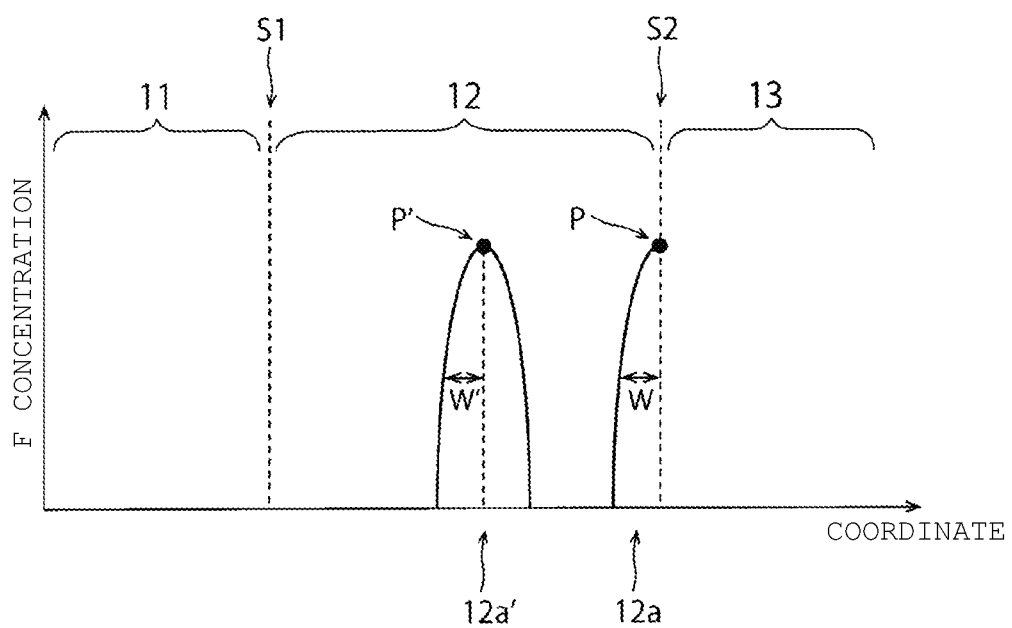
FIG. 8 is a graph illustrating an example of fluorine concentration distribution in a charge storage layer according to a second embodiment.

FIG. 8 is a graph illustrating an example of the fluorine concentration distribution in the charge storage layer 12 according to the second embodiment.

In FIG. 8, the fluorine concentration in the fluorine containing regions 12a and 12a' changes along the coordinates of the horizontal axis. Specifically, the fluorine concentration in the fluorine containing region 12a gradually increases and reaches the peak P at the interface S2. On the other hand, the fluorine concentration in the fluorine containing region 12a' gradually increases, reaches a peak P' at a location where the peak P' does not contact the interface S1 and the interface S2, and thereafter gradually decreases. The peak P is located on the side of the interface S2 of the interfaces S1 and S2. The peak P' may be located on the side of the interface S1 or on the side of the interface S2 of the interfaces S1 and S2.

FIG. 8 further illustrates the half width at half maximum W of the fluorine concentration distribution around the peak P and a half width at half maximum W' of the fluorine concentration distribution around the peak P'. Values of the half widths at half maximum W and W' of the present embodiment can be set to the same value as that of the half width at half maximum W according to the first embodiment. The value of the fluorine concentration at the peaks P and P' of the present embodiment can be set to the same value as that of the fluorine concentration at the peak P according to the first embodiment.

The charge storage layer 12 of the present embodiment can be formed by using, for example, the method described with reference to FIG. 5. For example, when a film thickness of the charge storage layer 12 is 6 nm, a first portion of the charge storage layer 12 is formed to have a film thickness of 3 nm by using the method of FIG. 5, and a second portion of the charge storage layer 12 is formed to have a film thickness of 3 nm by using the method of FIG. 5. As a result, the fluorine containing region 12a is formed in the first portion, and the fluorine containing region 12a' is formed in the second portion, whereby the charge storage layer 12 of the present embodiment is formed.

The fluorine concentration at the peaks P and P' of the present embodiment is set to $1.0 \times 10^{20}$ cm$^{-3}$ or higher, and specifically set to $1.0 \times 10^{20}$ cm$^{-3}$ or higher and $1.0 \times 10^{22}$ cm$^{-3}$ or lower.

As described above, the charge storage layer 12 of the present embodiment includes the fluorine containing regions 12a and 12a', and the peak P of the fluorine concentration in the fluorine containing region 12a is located on the side of the interface S2 of the interfaces S1 and S2. According to the present embodiment, the trap level in the vicinity of the interface S2 can be deepened by the fluorine containing region 12a, and the charge storage characteristic of the charge storage layer 12 can be effectively improved. According to the present embodiment, the fluorine containing region 12a can effectively prevent the leakage of the electron on the side of the tunnel insulating film 13, and the fluorine containing region 12a' can effectively prevent the leakage of the electron on the side of the block insulating film 11. Thus, according to the present embodiment, it is possible to effectively prevent the leakage of the charge stored in the charge storage layer 12.

The fluorine concentration in the fluorine containing region 12a has the same concentration profile as that of FIG. 3A, and may have the same concentration profile as that of FIG. 3B. The same also applies to the third and fourth embodiments which will be described below.

Third Embodiment

Figure 9:
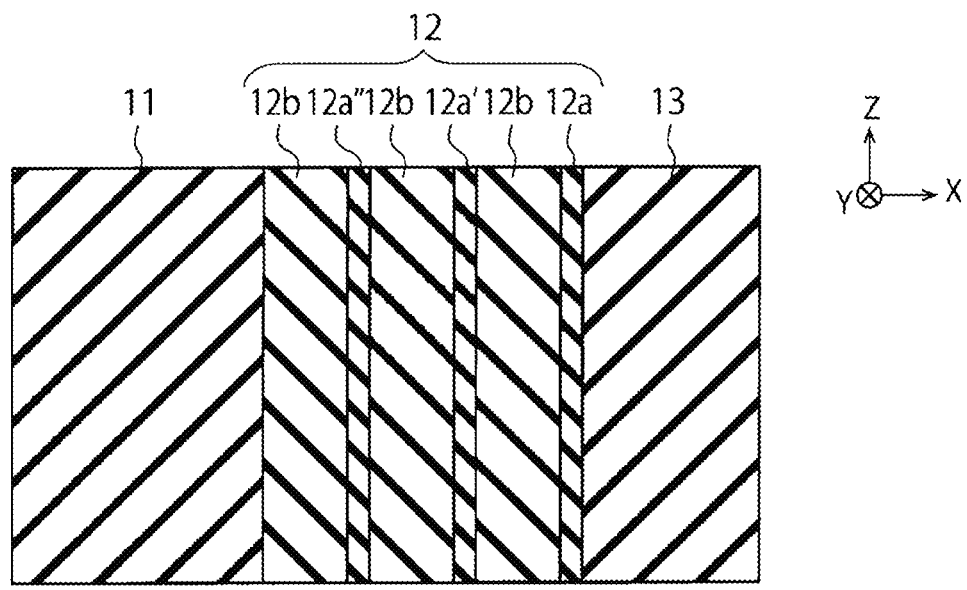
FIG. 9 illustrates a cross-sectional view of a structure of a charge storage layer according to a third embodiment.

FIG. 9 illustrates a cross-sectional view of a structure of the charge storage layer 12 according to a third embodiment. FIG. 9 illustrates the block insulating film 11, the charge storage layer 12, and the tunnel insulating film 13 in FIG. 1.

The charge storage layer 12 of the present embodiment includes the fluorine containing regions 12a and 12a', a further fluorine containing region 12a", and three other regions 12b. These regions 12a, 12a', 12a", and 12b are all formed of the silicon nitride film, and the fluorine containing regions 12a, 12a', and 12a" further contain fluorine as an impurity. On the other hand, the other region 12b does not contain fluorine or contains fluorine having concentration significantly lower than that of the fluorine containing region 12a. These regions 12a, 12a', 12a", and 12b are generally cylindrical in shape, the fluorine containing region 12a surrounds the fluorine containing region 12a', and the fluorine containing region 12a' surrounds the fluorine containing region 12a". In the present embodiment, the fluorine containing region 12a contacts the tunnel insulating film 13, and the fluorine containing regions 12a' and 12a" do not contact the block insulating film 11 and the tunnel insulating film 13. The fluorine containing region 12a" is an example of the second region.

Figure 10:
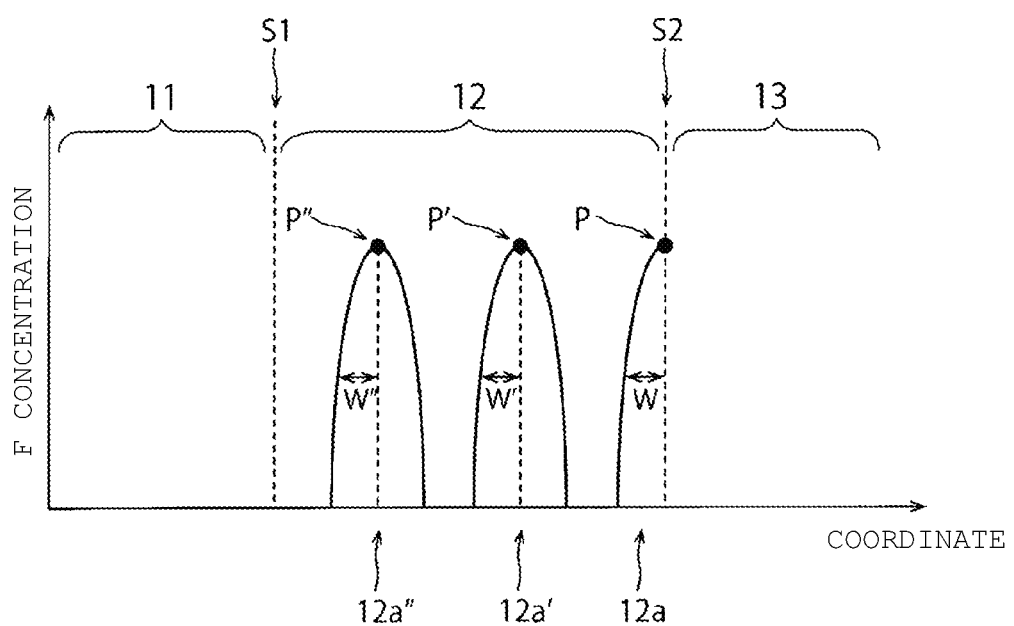
FIG. 10 is a graph illustrating an example of fluorine concentration distribution in a charge storage layer according to a third embodiment.

FIG. 10 is a graph illustrating an example of the fluorine concentration distribution in the charge storage layer 12 according to the third embodiment.

In FIG. 10, the fluorine concentration in the fluorine containing regions 12a, 12a', and 12a" changes along the coordinates of the horizontal axis. Specifically, the fluorine concentration in the fluorine containing region 12a gradually increases and reaches the peak P at the interface S2. On the other hand, the fluorine concentration in the fluorine containing regions 12a' and 12a" gradually increases, reaches the peak P' and a peak P''' at a location where the peaks P' and P''' do not contact the interface S1 and the interface S2, and thereafter gradually decreases. The peak P is located on the side of the interface S2 of the interfaces S1 and S2. The peaks P' and P''' may be located on the side of the interface S1 or on the side of the interface S2 of the interfaces S1 and S2.

FIG. 10 further illustrates the half width at half maximum W of the fluorine concentration distribution around the peak P, the half width at half maximum W' of the fluorine concentration distribution around the peak P', and a half width at half maximum W''' of the fluorine concentration distribution around the peak P'''. Values of the half widths at half maximum W, W', and W''' of the present embodiment can be set to the same value as that of the half width at half maximum W according to the first embodiment. The value of the fluorine concentration at the peaks P, P', and P''' of the present embodiment can be set to the same value as that of the fluorine concentration at the peak P according to the first embodiment.

The charge storage layer 12 of the present embodiment can be formed by using, for example, the method described with reference to FIG. 5. For example, when the film thickness of the charge storage layer 12 is 6 nm, the first portion of the charge storage layer 12 is formed to have the film thickness of 2 nm by using the method of FIG. 5, the second portion of the charge storage layer 12 is formed to have the film thickness of 2 nm by using the method of FIG. 5, and a third portion of the charge storage layer 12 is formed to have the film thickness of 2 nm by using the method of FIG. 5. As a result, the fluorine containing region 12a is formed in the first portion, the fluorine containing region 12a' is formed in the second portion, and the fluorine containing region 12a" is formed in the third portion, whereby the charge storage layer 12 of the present embodiment is formed. This method also applies to the fourth embodiment which will be described below.

The fluorine concentration at the peaks P, P', and P''' of the present embodiment is set to $1.0 \times 10^{20}$ cm$^{-3}$ or higher, and specifically set to $1.0 \times 10^{20}$ cm$^{-3}$ or higher and $1.0 \times 10^{22}$ cm$^{-3}$ or lower.

As described above, the charge storage layer 12 of the present embodiment includes the fluorine containing regions 12a, 12a', and 12a", and the peak P of the fluorine concentration in the fluorine containing region 12a is located on the side of the interface S2 of the interfaces S1 and S2. According to the present embodiment, the trap level in the vicinity of the interface S2 can be deepened by the fluorine containing region 12a, and the charge storage characteristic of the charge storage layer 12 can be effectively improved. According to the present embodiment, the fluorine containing region 12a can effectively prevent the leakage of the electron on the side of the tunnel insulating film 13, and the fluorine containing regions 12a' and 12a" can effectively prevent the leakage of the electron on the side of the block insulating film 11. Thus, according to the present embodiment, it is possible to effectively prevent the leakage of the charge stored in the charge storage layer 12.

Fourth Embodiment

Figure 11:
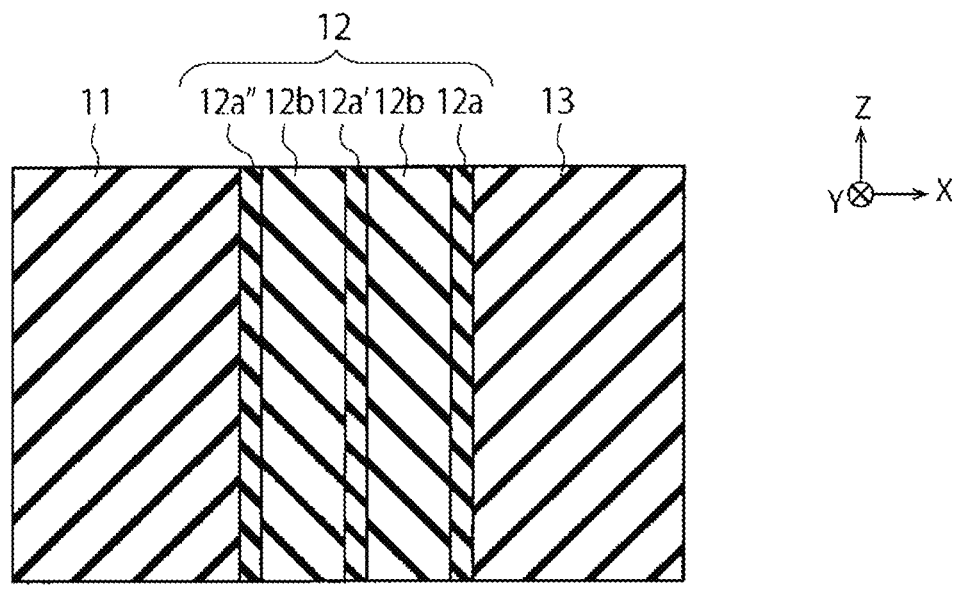
FIG. 11 illustrates a cross-sectional view of a structure of a charge storage layer according to a fourth embodiment.

FIG. 11 illustrates a cross-sectional view of a structure of the charge storage layer 12 according to a fourth embodiment. FIG. 11 illustrates the block insulating film 11, the charge storage layer 12, and the tunnel insulating film 13 in FIG. 1.

The charge storage layer 12 of the present embodiment includes the fluorine containing regions 12a, 12a', and 12a", and two other regions 12b. These regions 12a, 12a', 12a", and 12b are all formed of the silicon nitride film, and the fluorine containing regions 12a, 12a', and 12a" further contain fluorine as an impurity. On the other hand, the other region 12b does not contain fluorine or contains fluorine having concentration significantly lower than that of the fluorine containing region 12a. These regions 12a, 12a', 12a", and 12b are generally cylindrical in shape, the fluorine containing region 12a surrounds the fluorine containing region 12a', and the fluorine containing region 12a' surrounds the fluorine containing region 12a". In the present embodiment, the fluorine containing region 12a contacts the tunnel insulating film 13, the fluorine containing region 12a' does not contact the block insulating film 11 and the tunnel insulating film 13, and the fluorine containing region 12a" contacts the block insulating film 11.

Figure 12:
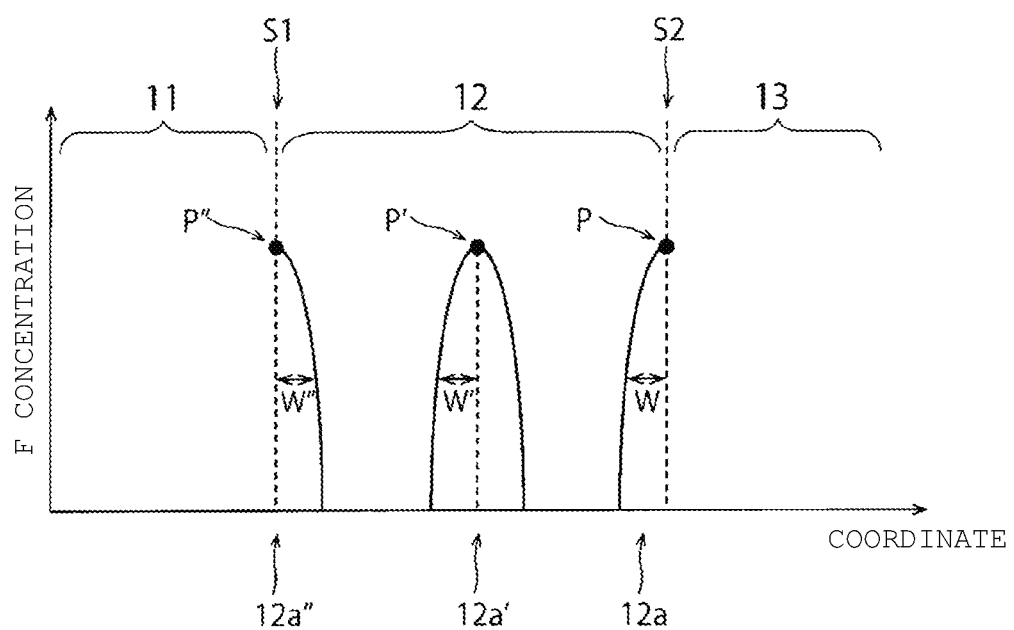
FIG. 12 is a graph illustrating an example of fluorine concentration distribution in a charge storage layer according to a fourth embodiment.

FIG. 12 is a graph illustrating an example of the fluorine concentration distribution in the charge storage layer 12 according to the fourth embodiment.

In FIG. 12, the fluorine concentration in the fluorine containing regions 12a, 12a', and 12a" changes along the coordinates of the horizontal axis. Specifically, the fluorine concentration in the fluorine containing region 12a gradually increases and reaches the peak P at the interface S2. The fluorine concentration in the fluorine containing regions 12a' gradually increases, reaches the peak P' at a location where the peak P' does not contact the interface S1 and the interface S2, and thereafter gradually decreases. The fluorine concentration in the fluorine containing region 12a" reaches the peak P''' at the interface S1, and thereafter gradually decreases. The peak P is located on the side of the interface S2 of the interfaces S1 and S2. The peak P' may be located on the side of the interface S1 or on the side of the interface S2 of the interfaces S1 and S2. The peak P''' is located on the side of the interface S1 of the interfaces S1 and S2.

FIG. 12 further illustrates the half width at half maximum W of the fluorine concentration distribution around the peak P, the half width at half maximum W' of the fluorine concentration distribution around the peak P', and the half width at half maximum W''' of the fluorine concentration distribution around the peak P'''. Values of the half widths at half maximum W, W', and W''' of the present embodiment can be set to the same value as that of the half width at half maximum W according to the first embodiment. The value of the fluorine concentration at the peaks P, P', and P''' of the present embodiment can be set to the same value as that of the fluorine concentration at the peak P according to the first embodiment.

The fluorine concentration at the peaks P, P', and P''' of the present embodiment is set to $1.0 \times 10^{20}$ cm$^{-3}$ or higher, and specifically set to $1.0 \times 10^{20}$ cm$^{-3}$ or higher and $1.0 \times 10^{22}$ cm$^{-3}$ or lower.

As described above, the charge storage layer 12 of the present embodiment includes the fluorine containing regions 12a, 12a', and 12a'', and the peak P of the fluorine concentration in the fluorine containing region 12a is located on the side of the interface S2 of the interfaces S1 and S2. According to the present embodiment, the trap level in the vicinity of the interface S2 can be deepened by the fluorine containing region 12a, and the charge storage characteristic of the charge storage layer 12 can be effectively improved. According to the present embodiment, the fluorine containing region 12a can effectively prevent the leakage of the electron on the side of the tunnel insulating film 13, and the fluorine containing regions 12a' and 12a'' can effectively prevent the leakage of the electron on the side of the block insulating film 11. Thus, according to the present embodiment, it is possible to effectively prevent the leakage of the charge stored in the charge storage layer 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a stacked structure including a plurality of electrode layers and a plurality of insulating layers that are alternately provided on a substrate; and
   a memory pillar extending through the stacked structure in a thickness direction, the memory pillar including a semiconductor layer extending along the thickness direction, a first insulating film surrounding the semiconductor layer, a charge storage layer surrounding the first insulating film, and a second insulating film surrounding the charge storage layer, wherein
   the charge storage layer contains fluorine, and a fluorine concentration in the charge storage layer has a gradient along a plane direction of the substrate with a peak, and
   a first distance from an inner end of the charge storage layer to the peak in the plane direction is shorter than a second distance from an outer end of the charge storage layer to the peak in the plane direction.

2. The semiconductor memory device according to claim 1, wherein the fluorine concentration at the peak is $1.0 \times 10^{20}$ cm$^{-3}$ or higher.

3. The semiconductor memory device according to claim 1, wherein the fluorine concentration at the peak is $1.0 \times 10^{22}$ cm$^{-3}$ or lower.

4. The semiconductor memory device according to claim 1, wherein a half width at half maximum of the peak in the plane direction is 2.5 nm or less.

5. The semiconductor memory device according to claim 1, wherein the peak is at the inner end of the charge storage layer.

6. The semiconductor memory device according to claim 1, wherein the charge storage layer is an insulating film containing silicon and nitrogen.

7. The semiconductor memory device according to claim 1, wherein the fluorine concentration in the charge storage layer has a second peak farther from the inner end of the charge storage layer than the peak.

8. The semiconductor memory device according to claim 7, wherein the second peak is between the peak and the outer end of the charge storage layer.

9. The semiconductor memory device according to claim 7, wherein the second peak is at the outer end of the charge storage layer.

10. The semiconductor memory device according to claim 7, wherein the fluorine concentration at each of the peak and the second peak is between $1.0 \times 10^{20}$ cm$^{-3}$ and $1.0 \times 10^{22}$ cm$^{-3}$.

11. The semiconductor memory device according to claim 7, wherein the fluorine concentration in the charge storage layer has a third peak farther from the inner end of the charge storage layer than the second peak.

12. The semiconductor memory device according to claim 11, wherein the third peak is between the second peak and the outer end of the charge storage layer.

13. The semiconductor memory device according to claim 11, wherein the third peak is at the outer end of the charge storage layer.

14. The semiconductor memory device according to claim 11, wherein the fluorine concentration at each of the peak, the second peak, and the third peak is between $1.0 \times 10^{20}$ cm$^{-3}$ and $1.0 \times 10^{22}$ cm$^{-3}$.

15. The semiconductor memory device according to claim 1, wherein the first insulating film is in direct contact with an inner surface of the charge storage layer.

16. The semiconductor memory device according to claim 1, wherein the second insulating film is in direct contact with an outer surface of the charge storage layer.

* * * * *